US010984143B2

(12) United States Patent
Fujita et al.

(10) Patent No.: US 10,984,143 B2
(45) Date of Patent: Apr. 20, 2021

(54) RECIPE CREATION DEVICE FOR USE IN SEMICONDUCTOR MEASUREMENT DEVICE OR SEMICONDUCTOR INSPECTION DEVICE

(71) Applicant: Hitachi High-Tech Corporation, Tokyo (JP)

(72) Inventors: Hiromi Fujita, Tokyo (JP); Toshikazu Kawahara, Tokyo (JP); Yoshihiro Ota, Tokyo (JP); Shigeki Sukegawa, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 15/544,151

(22) PCT Filed: Jan. 23, 2015

(86) PCT No.: PCT/JP2015/051756
§ 371 (c)(1),
(2) Date: Jul. 17, 2017

(87) PCT Pub. No.: WO2016/117103
PCT Pub. Date: Jul. 28, 2016

(65) Prior Publication Data
US 2017/0371981 A1    Dec. 28, 2017

(51) Int. Cl.
*G05B 19/418*   (2006.01)
*G06F 30/00*    (2020.01)
*G06F 30/398*   (2020.01)

(52) U.S. Cl.
CPC ....... *G06F 30/00* (2020.01); *G05B 19/41865* (2013.01); *G05B 19/41875* (2013.01);
(Continued)

(58) Field of Classification Search
CPC ...... G06F 17/50; G06F 17/5081; G06F 30/00; G06F 30/398; G05B 19/41865;
(Continued)

(56) References Cited

U.S. PATENT DOCUMENTS 7,065,425 B1 *  6/2006  Kay ................. G05B 19/41875
                                                  700/110
7,231,079 B2    6/2007  Okuda et al.
(Continued)

FOREIGN PATENT DOCUMENTS

JP   2002-323458 A   11/2002
JP    2004-95657 A    3/2004
(Continued)

OTHER PUBLICATIONS

International Search Report (PCT/ISA/210) issued in PCT Application No. PCT/JP2015/051756 dated Apr. 14, 2015 with English translation (Four (4) pages).
(Continued)

*Primary Examiner* — M.N. Von Buhr
(74) *Attorney, Agent, or Firm* — Crowell & Moring LLP

(57) ABSTRACT

The purpose of the present invention is to provide a recipe creation device, with the goal of using past recipe data in order to highly efficiently create recipes. As an embodiment with which to achieve this goal, there is provided a recipe creation device comprising an arithmetic processing device that, on the basis of design data for a semiconductor element, establishes measurement conditions or inspection conditions by a semiconductor measurement device or a semiconductor inspection device, wherein the arithmetic processing device is configured to be able to access a database in which the measurement conditions or inspection conditions, and the pattern information of the semiconductor element, are stored in associated form, and the measurement conditions or
(Continued)

inspection conditions are selected through a search using pattern information of the semiconductor element.

7 Claims, 12 Drawing Sheets

(52) U.S. Cl.
CPC .. *G06F 30/398* (2020.01); *G05B 2219/37448* (2013.01); *Y02P 90/02* (2015.11)

(58) Field of Classification Search
CPC .... G05B 19/41875; G05B 2219/37448; Y02P 90/20; Y02P 90/22; Y02P 90/02
See application file for complete search history.

(56) References Cited

U.S. PATENT DOCUMENTS

| | | | |
|---|---|---|---|
| 8,189,040 B2 | 5/2012 | Fujita et al. | |
| 8,283,630 B2 | 10/2012 | Miyamoto et al. | |
| 9,501,598 B1* | 11/2016 | O'Riordan | G06F 30/36 |
| 9,846,931 B2* | 12/2017 | Toyoda | H01J 37/222 |
| 2002/0113234 A1* | 8/2002 | Okuda | G01N 21/9501 257/48 |
| 2004/0199483 A1* | 10/2004 | Nishigaki | G06F 30/00 706/46 |
| 2006/0248078 A1* | 11/2006 | Gross | G06F 16/3322 |
| 2007/0156379 A1* | 7/2007 | Kulkarni | G06F 17/5045 703/14 |
| 2007/0288219 A1* | 12/2007 | Zafar | G03F 1/84 703/14 |
| 2008/0159609 A1* | 7/2008 | Miyamoto | G06T 7/0006 382/128 |
| 2008/0244483 A1* | 10/2008 | Chang | G06F 30/398 716/106 |
| 2008/0250384 A1 | 10/2008 | Duffy et al. | |
| 2009/0052765 A1* | 2/2009 | Toyoda | G06K 9/00 382/149 |
| 2010/0131091 A1* | 5/2010 | Ferrario | G05B 19/41865 700/98 |
| 2011/0112678 A1* | 5/2011 | Hsu | G05B 19/41865 700/103 |
| 2012/0290990 A1* | 11/2012 | Toyoda | G03F 1/86 716/52 |
| 2013/0066454 A1 | 3/2013 | Geshel et al. | |
| 2013/0212160 A1* | 8/2013 | Lawson | G05B 19/4185 709/203 |
| 2013/0339810 A1* | 12/2013 | Shimizu | G06F 30/00 714/57 |
| 2014/0177940 A1* | 6/2014 | Nakagaki | H01L 22/12 382/149 |
| 2014/0214192 A1* | 7/2014 | Juang | H01L 22/12 700/105 |
| 2014/0376801 A1* | 12/2014 | Karsenti | G06T 7/001 382/145 |
| 2016/0196379 A1* | 7/2016 | Adel | G03F 1/36 716/52 |

FOREIGN PATENT DOCUMENTS

| | | |
|---|---|---|
| JP | 2009-38117 A | 2/2009 |
| JP | 2010-514226 A | 4/2010 |
| JP | 2013-62508 A | 4/2013 |
| JP | 5530601 B2 | 6/2014 |

OTHER PUBLICATIONS

Japanese-language Written Opinion (PCT/ISA/237) issued in PCT Application No. PCT/JP2015/051756 dated Apr. 14, 2015 (Three (3) pages).

* cited by examiner

[Fig. 1]
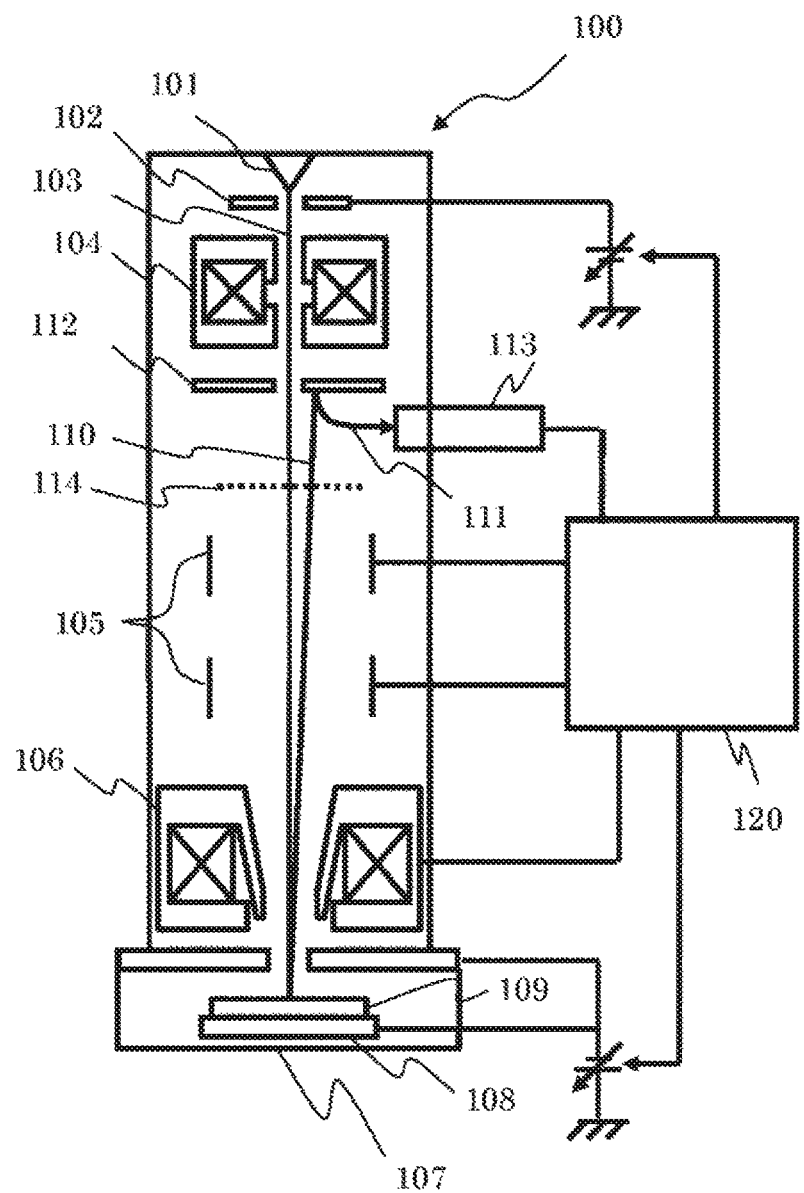

[Fig. 2]
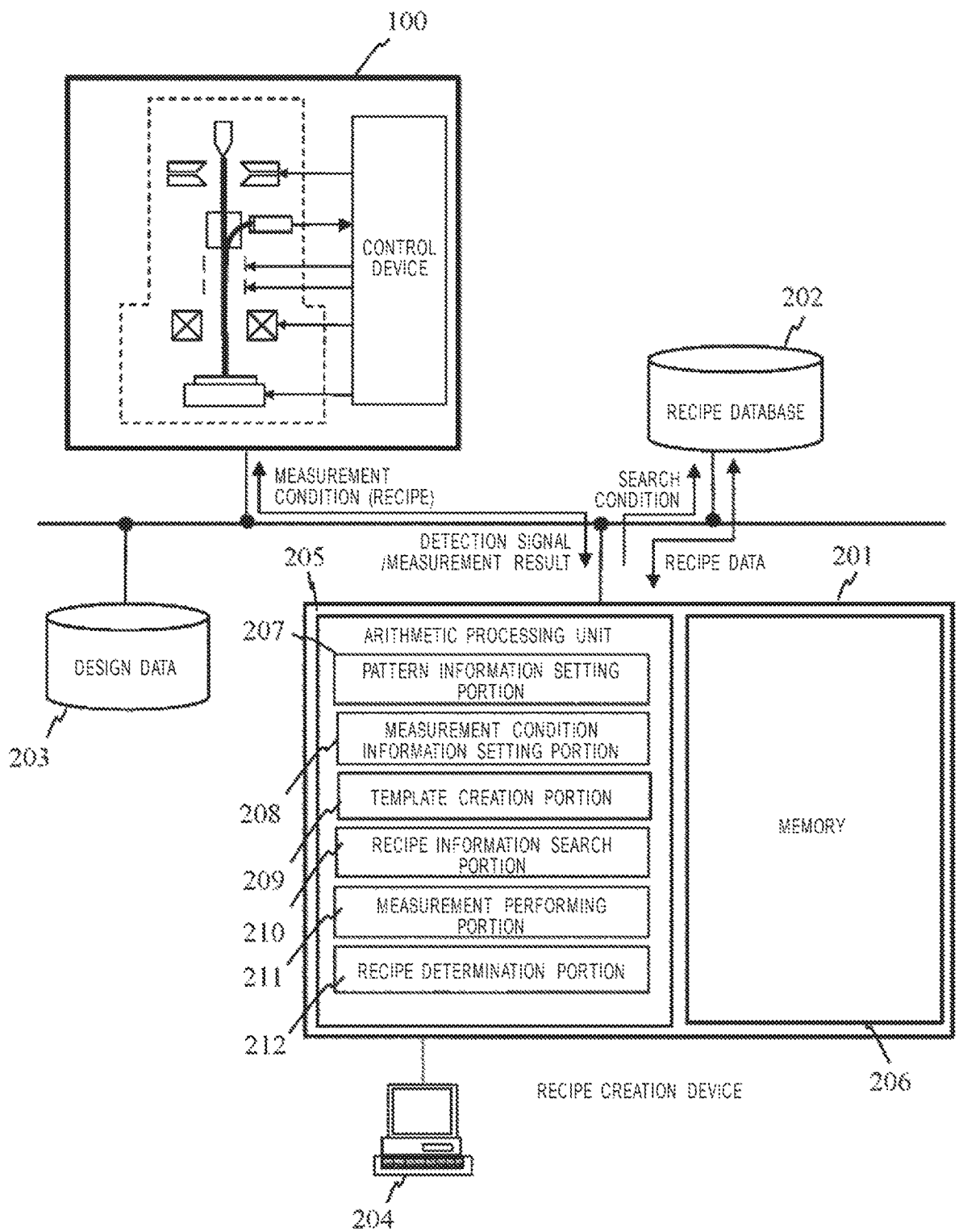

[Fig. 3]
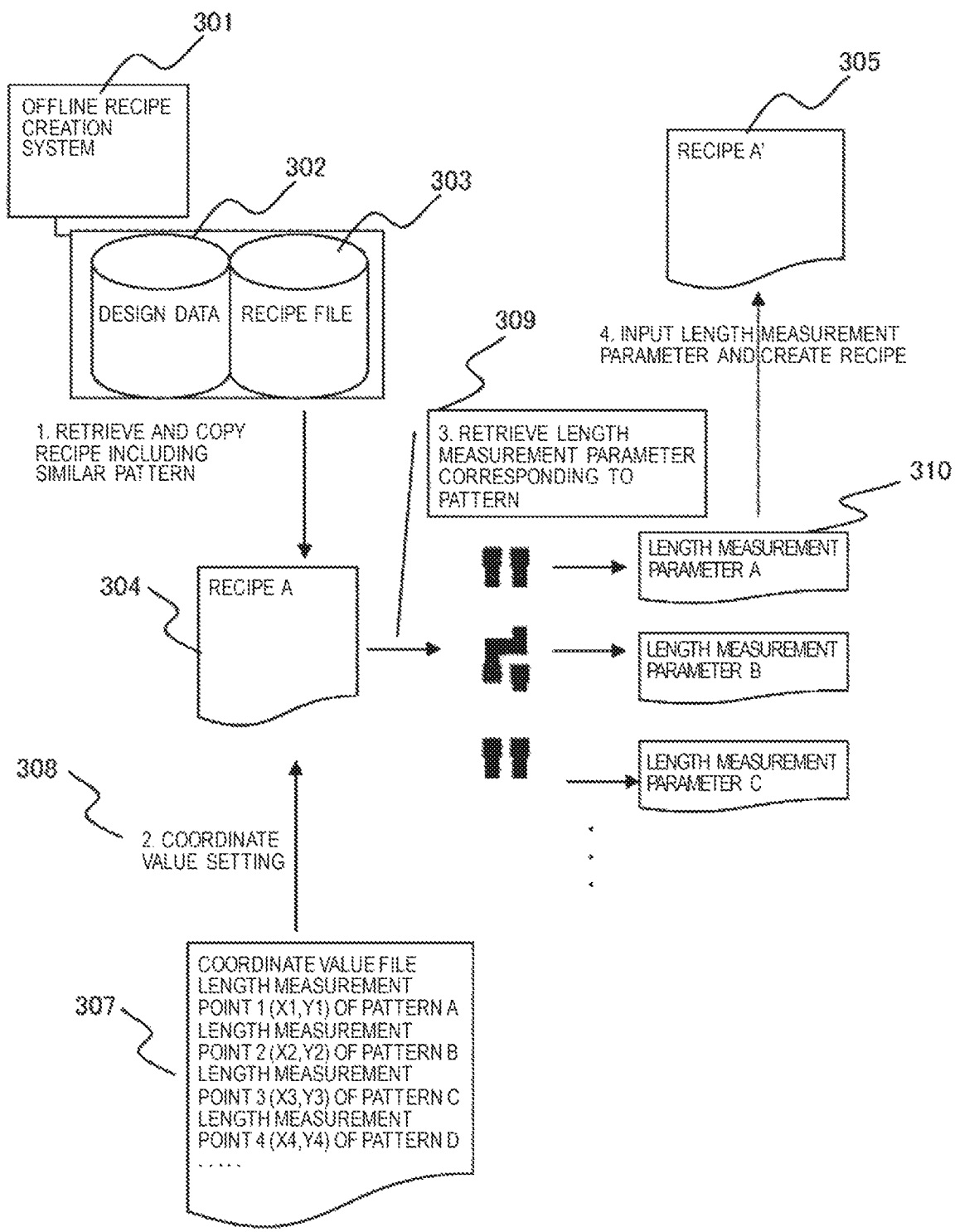

[Fig. 4]
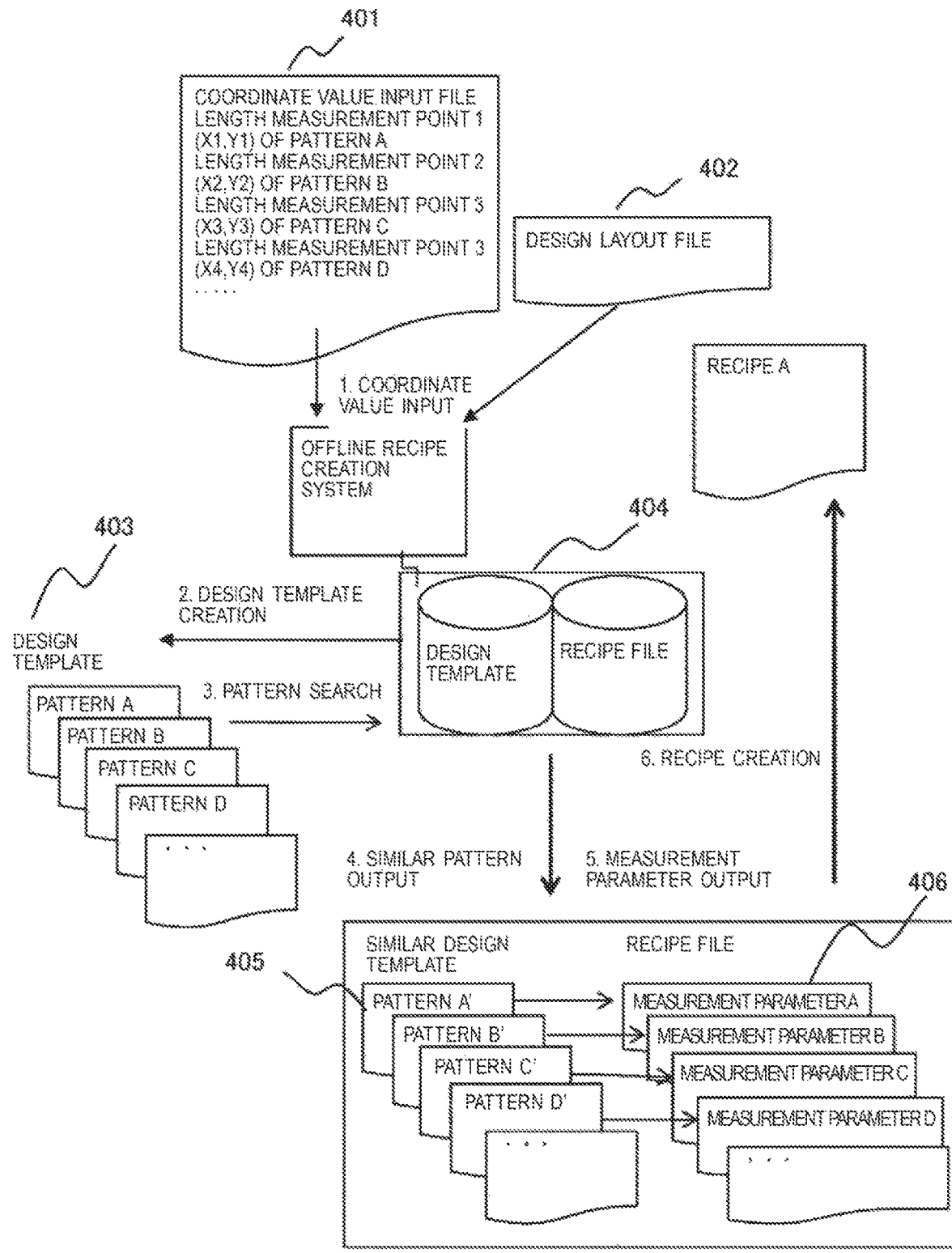

[Fig. 5]
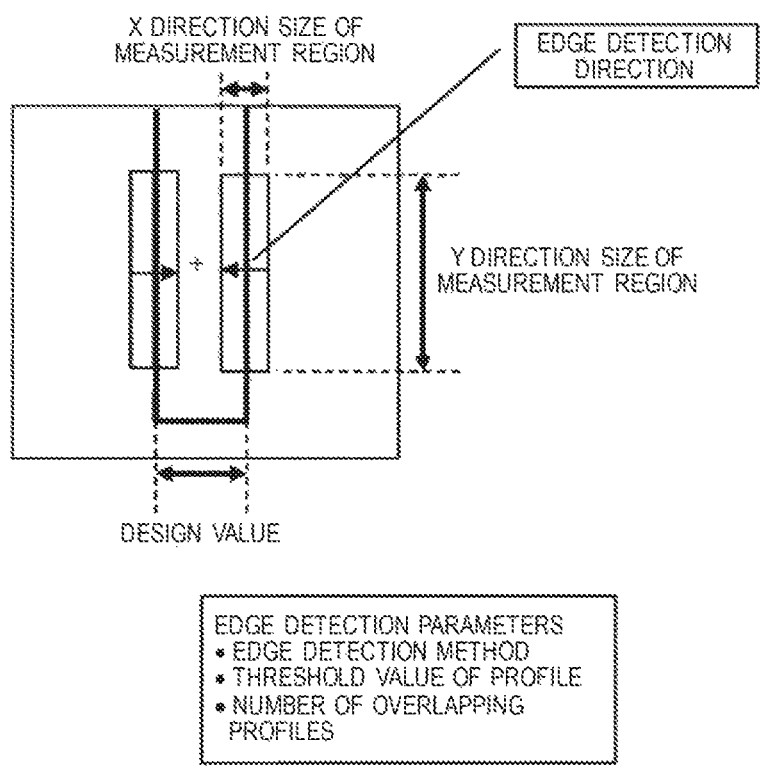

[Fig. 6]
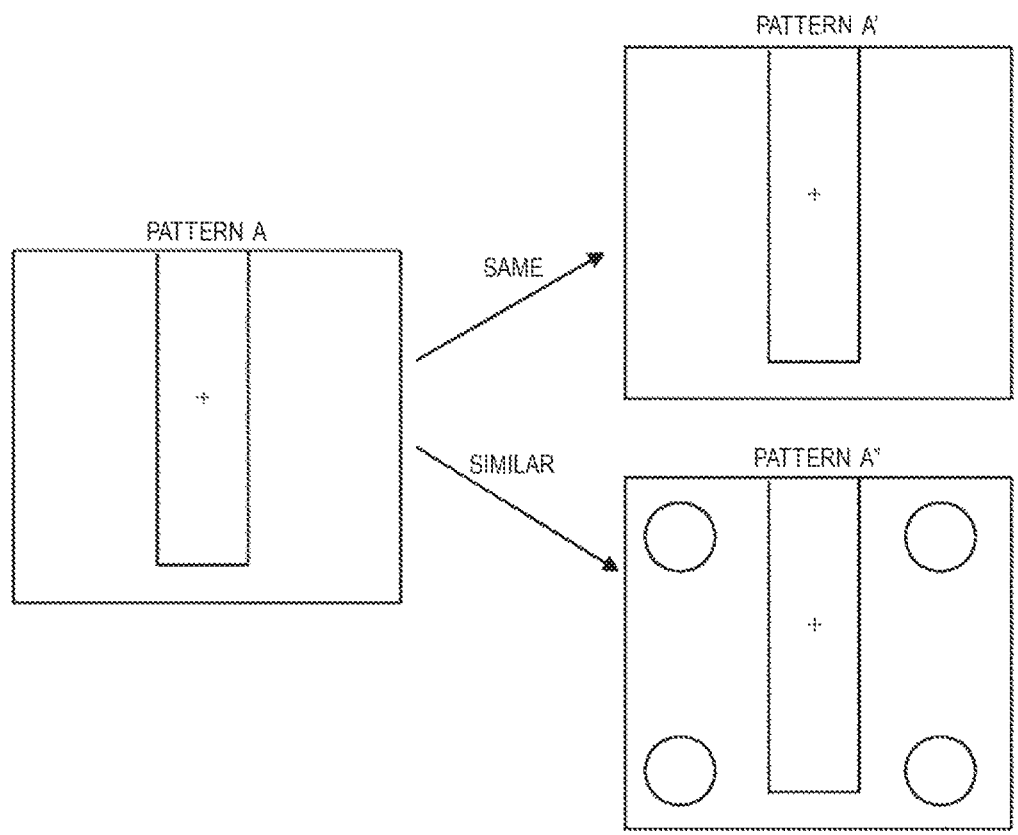
[Fig. 7]

[Fig. 8]
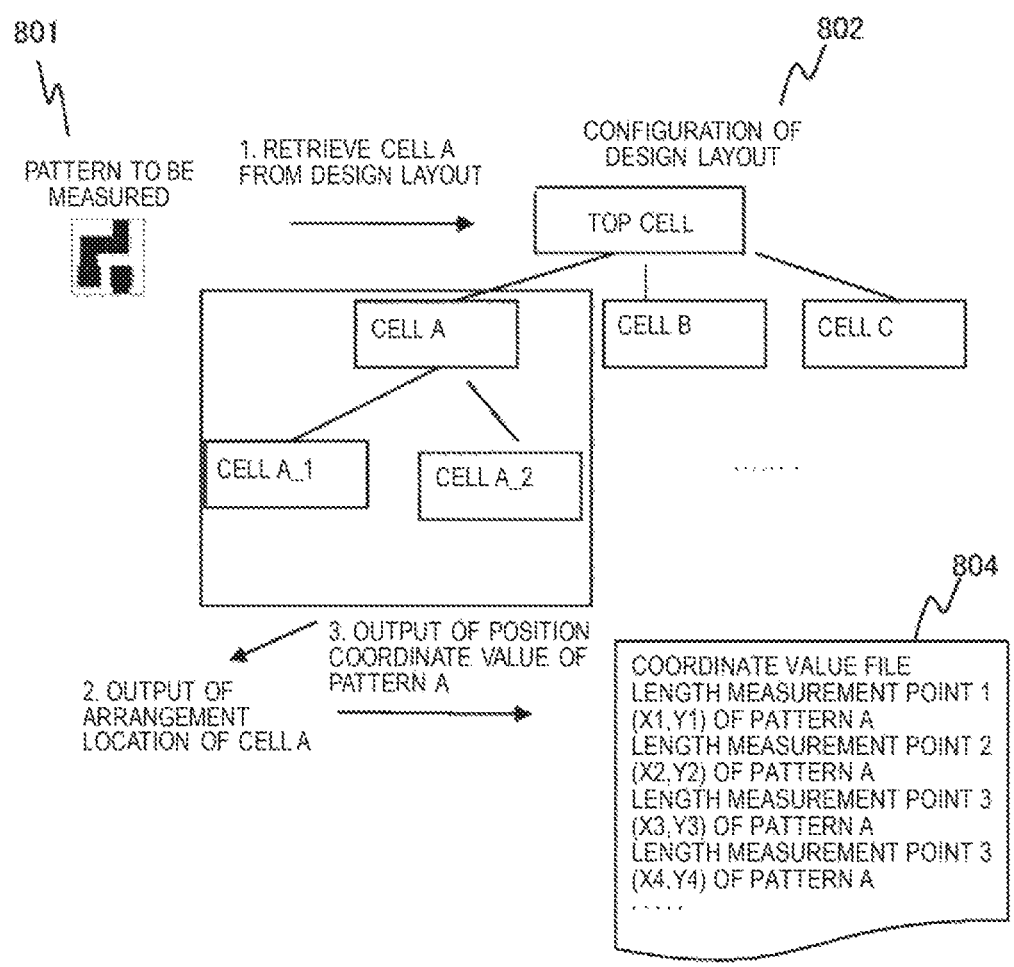

[Fig. 9]
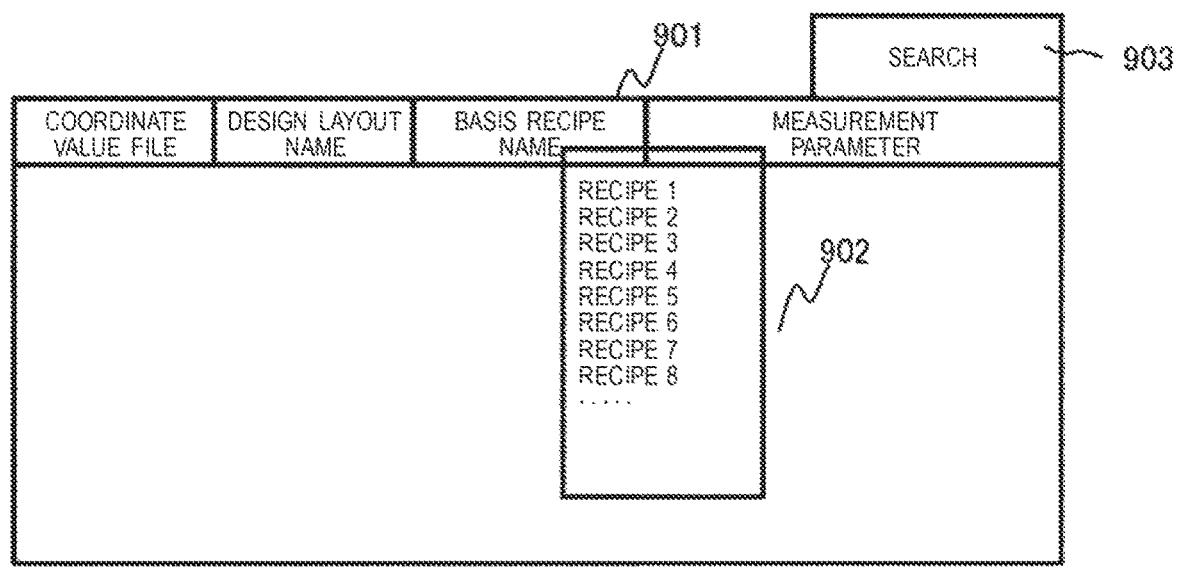

[Fig. 10]

| COORDINATE VALUE FILE A | DESIGN DATA A | RECIPE 5 | MEASUREMENT PARAMETER ||
|---|---|---|---|---|
| | | | CURSOR SHAPE | EDGE DETECTION PARAMETERS |
| X1, Y1 | | | | PARAMETER 1<br>PARAMETER 2<br>...... |
| X2, Y2 | | | | PARAMETER 3<br>PARAMETER 4<br>...... |
| X3, Y3 | | | | |
| ...... | | | | |

1001, 1002

SEARCH

RECIPE OUTPUT

[Fig. 11]
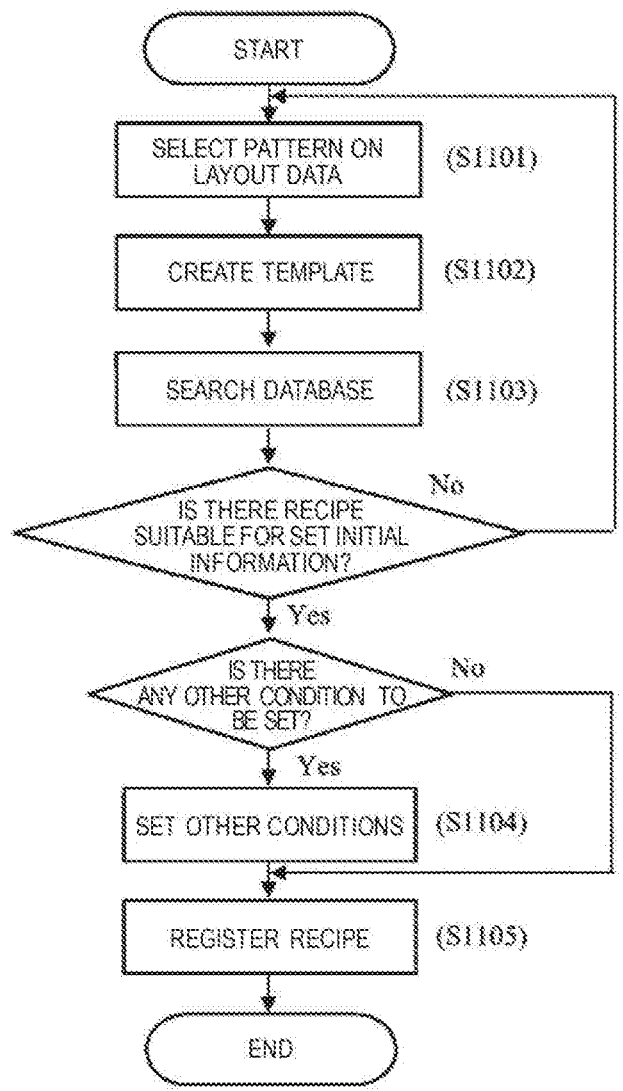

[Fig. 12]
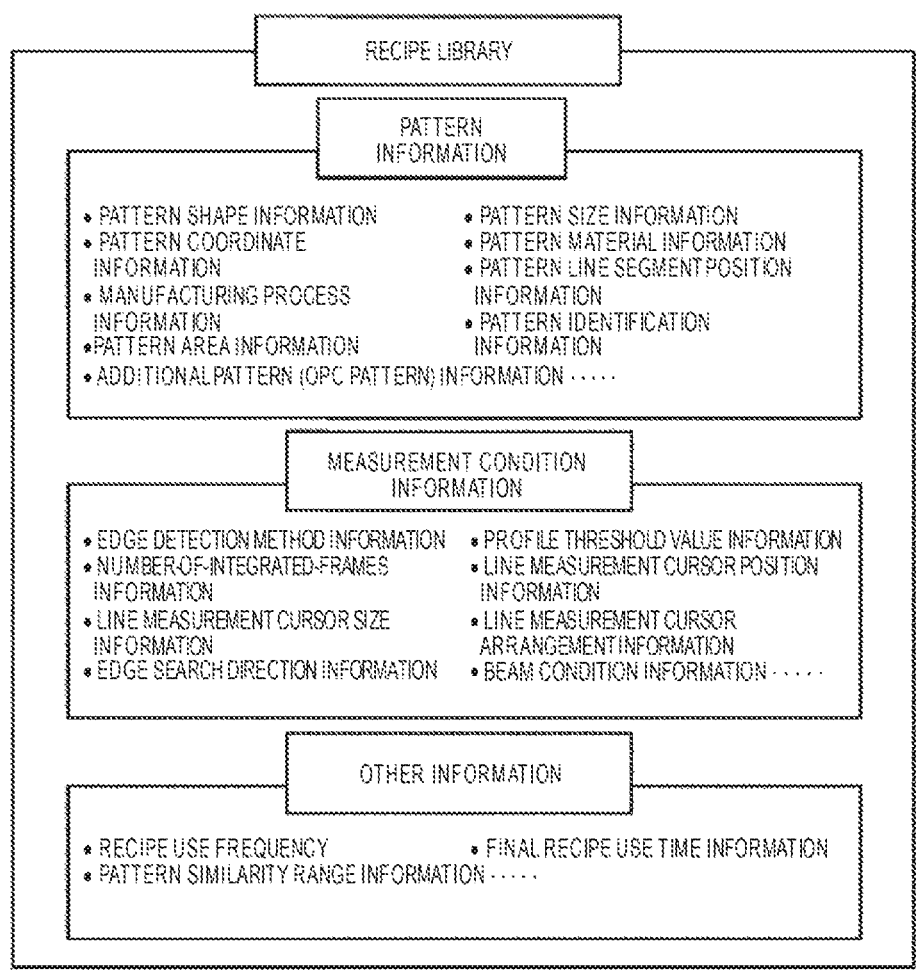

RECIPE CREATION DEVICE FOR USE IN SEMICONDUCTOR MEASUREMENT DEVICE OR SEMICONDUCTOR INSPECTION DEVICE

TECHNICAL FIELD

The present invention relates to a recipe creation device for use in a semiconductor device measurement device, and particularly to a recipe creation device which can highly efficiently use past recipe data.

BACKGROUND ART

Semiconductor devices have been becoming large-scaled and high-integrated. With the advance of a fine processing technique, both of logic devices and memory devices have been diversified, and the number thereof has also been increased. A device requires design layout data in which a shape thereof is described, and the number of design layout data has also been increased due to an increase in the number of devices.

In a device manufacturing process, a pattern is measured by using a critical dimension SEM (CD-SEM), but a recipe in which measurement procedures are written is required to be created.

In order to save the time and effort to create a recipe, PTL 1 discloses a recipe creation method of automatically generating a recipe by using design data for a semiconductor device. More specifically, a recipe creation method is disclosed in which the type of dimension to be measured is set on the basis of position information and design data of a circuit pattern which is a measurement target, and a measurement target region is set according to the type.

CITATION LIST

Patent Literature

PTL 1: Japanese Patent No. 5530601 (corresponding U.S. Pat. No. 8,283,630)

SUMMARY OF INVENTION

Technical Problem

If devices are different from each other, different coordinate values are measured, and thus different recipes are required to be created for respective devices. Thus, the number of created recipes is increased. The number of measurement points even in a single sample tends to be increased due to complication and micronization of a pattern, and thus it is desirable to create a recipe more simply.

On the other hand, an enormous amount of recipe data is created hitherto, and if past recipe data can be used with high efficiency, the time and effort to create recipes may be saved. For example, even if coordinate values are different each other in different devices, each component such as a transistor forming a layout is used in common, and thus there are a plurality of locations where pattern shapes are the same as each other. PTL 1 does not disclose that past recipe data is used. The present inventor focuses on this fact, and proposes a recipe creation device, with the goal of using past recipe data in order to highly efficiently create recipes.

Solution to Problem

In order to achieve the object, there is provided a recipe creation device comprising an arithmetic processing device that, on the basis of design data for a semiconductor element, establishes measurement conditions or inspection conditions by a semiconductor measurement device or a semiconductor inspection device, wherein the arithmetic processing device is configured to be able to access a database in which the measurement conditions or inspection conditions, and the pattern information of the semiconductor element, are stored in associated form, and the measurement conditions or inspection conditions are selected through a search using pattern information of the semiconductor element.

Advantageous Effects of Invention

According to the configuration, it is possible to highly efficiently extract a measurement condition or an inspection condition from past recipes and thus to reduce the time and effort to create recipes.

BRIEF DESCRIPTION OF DRAWINGS

FIG. 1 is a diagram illustrating a summary of a scanning electron microscope.

FIG. 2 is a diagram illustrating an example of a semiconductor measurement system.

FIG. 3 is a diagram illustrating a summary of a recipe creation process using an offline recipe creation system.

FIG. 4 is a diagram illustrating a summary of a recipe creation method using existing recipes.

FIG. 5 is a diagram illustrating examples of line measurement parameters.

FIG. 6 is a diagram exemplifying the same pattern and a similar pattern.

FIG. 7 is a diagram illustrating an example of a recipe configuration file.

FIG. 8 is a diagram illustrating a process of extracting coordinate information from a measurement target pattern.

FIG. 9 is a diagram illustrating an example of an operation graphical user interface (GUI) for setting a pattern search condition.

FIG. 10 is a diagram illustrating an example of a search result checking screen.

FIG. 11 is a flowchart illustrating a process of creating a new recipe from existing recipes.

FIG. 12 is a diagram illustrating an example of a recipe library.

DESCRIPTION OF EMBODIMENTS

Figure 13:
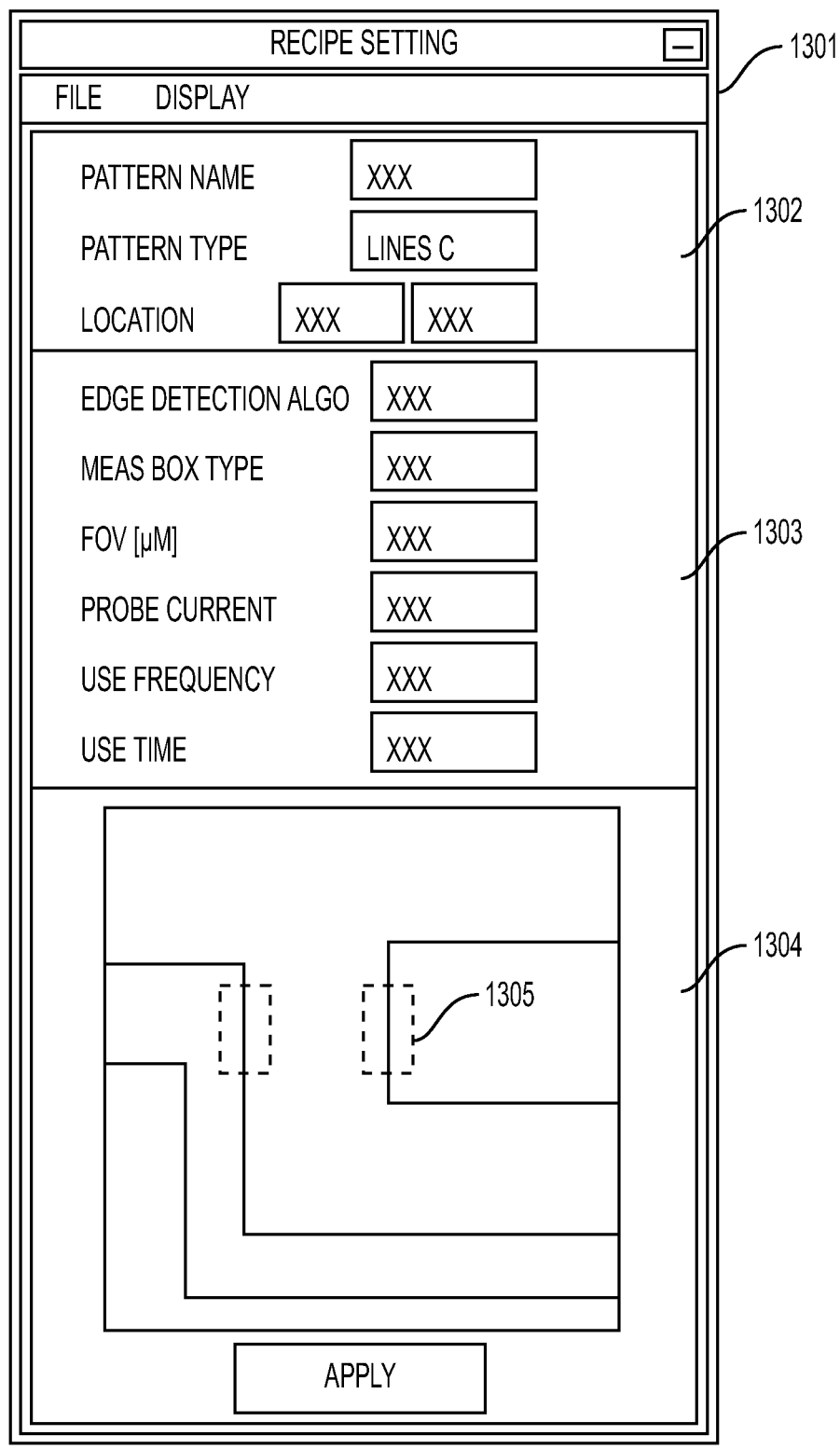
FIG. 13 is a diagram illustrating an example of a GUI screen for inputting conditions for creating a recipe.

In order to measure or inspect a pattern on a wafer on a CD-SEM which is a semiconductor measurement device, or a semiconductor inspection device, when a recipe is created, movement to a measurement coordinate value on the wafer is performed, and then a measurement parameter is designated while checking a measured pattern (SEM image). Thus, recipe creation on the CD-SEM or the inspection device requires time.

If recipe creation is performed on the device, an operation time of the device is reduced, and thus there is an offline recipe creation system in which a recipe for a CD-SEM can be created offline. FIG. 3 illustrates a summary of a recipe creation process using an offline recipe creation system.

An offline system 301 is a system which includes a database in which design data 302 and a recipe file 303 are preserved, and creates a recipe offline by using a design template instead of an SEM image.

A pattern to be measured is the same as a pattern measured in the past except for only different coordinate values, or there are many patterns obtained by changing arrangement of past patterns in proportion to the generations of a product. Therefore, regarding a recipe creation method, there may be a method in which a recipe including a pattern similar to a pattern of a new device is found and is copied 304, a copied recipe A 305 is edited, and a recipe A' 306 for the new device is created.

In this case, since a coordinate value of a measurement target pattern or the like of the recipe A' is different from that of the recipe A, coordinate value setting 308 for the recipe A is performed by reading a coordinate value file 307. Next, a length measurement parameter of a pattern for each coordinate value is required to be set, and thus a length measurement parameter is retrieved 309 for each pattern.

Since there are many cases where a new pattern to be measurement is similar to a past pattern, a measurement parameter for the past pattern may be copied so that the recipe A is created, but a measurement parameter 310 for the past pattern is required to be manually retrieved and designated. Since shapes of patterns are diversified depending on lines, holes, and the like, and dimensions are different from each other, it is considerably difficult to manually designate measurement parameters.

The present example is aimed to simplify or automate setting when a new recipe is created by using past recipe data, and, according to the present example, it is possible to reduce recipe creation time.

In the present example, when a recipe of a measurement pattern which is a measurement target is created, a design template for retrieving past recipe data is created by using design data of a region including the measurement pattern. Specifically, design template data of a region including a pattern desired to be measured is created by using layout data which is generated on the basis of design data for a semiconductor device, and is compared with design template data (pattern information extracted from the design data) stored in correlation with a recipe created in the past, or past recipes so that a past recipe having the same or similar pattern line width, a pattern shape, and the like is selected, and data for recipe creation is collected by extracting a measurement parameter of the past recipe. The extracted measurement parameter is changed in accordance with a measurement magnification of the new measurement pattern, or other measurement parameters are optimized, so that a recipe is created. According to such a recipe creation method, it is possible to simplify or automate recipe creation.

If a pattern (design) to be measured is input, design data of a region including the pattern to be measured can be retrieved, and a pattern coordinate value desired to be measured can also be automatically output on the basis of the design data.

According to the present example, in recipe creation, since a measurement parameter is automatically set by using past recipe, and a position coordinate value of a measurement pattern is extracted, so that recipe creation is simplified, recipe creation efficiency is improved.

Hereinafter, with reference to the drawings, a description will be made of a recipe creation device, and a charged particle beam apparatus operated by the recipe creation device. FIG. 1 is a diagram illustrating a summary of a scanning electron microscope whose operation is controlled according to a recipe (an operation program for operating a device). In an SEM 100, an electron beam 103 which is extracted from an electron source 101 by an extraction electrode 102 and is accelerated by an acceleration electrode (not illustrated) is narrowed by a condenser lens 104 which is one type of condensing lens, and is applied onto a sample 109 by a scanning deflector 105 in a one-dimensional manner or a two-dimensional manner. The electron beam 103 is decelerated by a negative voltage applied from an electrode built into a sample stage 108, and is focused due to lens action of an objective lens 106 so as to be applied to a sample 109. The inside of a sample chamber 107 is maintained in a predetermined degree of vacuum by a vacuum pump (not illustrated).

If the electron beam 103 is applied to the sample 109, electrons 110 such as secondary electrons and backscattering electrons are emitted from the irradiation location. The electrons 110 are accelerated in the electron source direction due to acceleration action based on the negative voltage applied to the sample so as to collide with a conversion electrode 112, and thus generate secondary electrons 111. The secondary electrons 111 emitted from the conversion electrode 112 are captured by a detector 113, and an output from the detector 113 is changed depending on an amount of the captured secondary electrons. Luminance of a display device (not illustrated) changes according to the output. For example, in a case where a two-dimensional image is formed, a deflection signal for the scanning deflector 105 is synchronized with an output from the detector 113, and thus an image of a scanning region is formed. The scanning electron microscope exemplified in FIG. 1 is provided with a deflector (not illustrated) which is moved in a scanning region of an electron beam. The deflector is used to form an image or the like of a pattern having the same pattern present at a different position. The deflector is also referred to as an image shift deflector, and can move a position of a field of view of the electron microscope without movement or the like of a sample using the sample stage. A common deflector may be used as the image shift deflector and the scanning deflector, and an image shift signal and a scanning signal may be superimposed on each other so as to be supplied to the deflector.

In the example illustrated in FIG. 1, a description has been made of an example in which electrons emitted from the sample are temporarily converted by the conversion electrode so as to be detected, but any other configuration may be used, and, for example, there may be a configuration in which an electronic image-intensifying tube or a detection surface of a detector is disposed on a trajectory of an accelerated electron.

A control device 120 has a function of controlling each constituent element of the scanning electron microscope on the basis of information stored in a recipe, a function of forming an image on the basis of detected electrons, and a function of measuring a width of a pattern formed on a sample on the basis of an intensity distribution of detected electron, called a line profile.

FIG. 2 is a diagram illustrating an example of a measurement system including the SEM 100. The system exemplified in FIG. 2 includes the SEM 100, a recipe database 202 in which recipe data is stored, a design data storage medium 203 in which design data for a semiconductor device or layout data generated on the basis of the design data is stored, and a recipe creation device 201 which creates a recipe on the basis of information stored in the recipe database 202 or the design data storage medium 203.

The recipe creation device 205 is configured to be able to access the design data storage medium 203 and the recipe database 202, and includes an arithmetic processing unit 205 which creates a recipe, and a memory 206 for storing necessary information. The arithmetic processing unit 205 includes a pattern information setting portion 207 which sets information regarding a pattern which is a measurement target on the basis of information which is input from an input device 204 or the like, and a measurement condition information setting portion 208 which sets a recipe on the basis of optical conditions or the like for the scanning electron microscope, which are input from the input device 204 or the like. A template creation portion 209 generates a template on the basis of pattern information set by the pattern information setting portion 207.

The arithmetic processing unit further includes a recipe information search portion 210 which searches for design template data stored in correlation with a recipe or past recipe according to a method which will be described later, a measurement performing portion 211 which performs pattern measurement on the basis of a detection signal obtained by the SEM 100, and a recipe determination portion 212 which determines a created recipe.

The measurement conditions or the like may be arbitrarily set by the input device 204, and a recipe for measurement is generated on the basis of the set measurement conditions.

Example 1

Hereinafter, a description will be made of a process of creating a recipe for a CD-SEM by using design data. The present example is also applicable to an offline recipe creation system which creates a recipe offline.

1. Input of Measurement Coordinate Value

It is assumed that a user designates a coordinate value for a pattern to be measured. For example, the pattern information setting portion 207 creates a file in which pairs of coordinate values and measurement magnifications are listed, as a coordinate value input file 401, on the basis of information which is input from the input device 204. The created coordinate value input file is input to an offline recipe creation system, or is stored in the memory 206 in the recipe creation device 201 exemplified in FIG. 2.

2. Input of Design Layout

A design layout file 402 for a device is input to the offline recipe creation system. The recipe creation device 201 exemplified in FIG. 2 accesses the design data storage medium 203 by using the created coordinate value input file 401, and reads design data corresponding to the input information.

3. Design Template Creation

A design template 403 is created on the basis of design data corresponding to each coordinate value stored in the coordinate value input file 401, and a designated magnification. The design template is a file in which a pattern shape obtained on the basis of the design layout file is represented by a coordinate value and a direction. In the recipe creation device 205 exemplified in FIG. 2, vector data corresponding to an associated coordinate is read from the read pieces of design data, and is used as the design template.

4. Output of Measurement Parameters

A user sets measurement parameters on the basis of the design template. A regarding setting method, a pattern image is created on the basis of the design template, and measurement parameters suitable for the pattern image are set while checking the pattern image. The measurement parameters include measurement cursor parameters, edge detection parameters, and the like.

FIG. 5 illustrates line measurement parameters. For example, the measurement cursor parameters include an X direction size of a measurement region, a Y direction size of the measurement region, a design value, and an edge search direction. The edge detection parameters include an edge detection method, a threshold value of a profile, the number of superposed profiles, and the like. The measurement cursor parameters can be automatically set since a shape is understood on the basis of the design template, but the edge detection parameters are optimal experience values as results of repeatedly performing measurement on the CD-SEM and thus cannot be automatically set on the basis of the design data. These measurement parameters are preserved to form pairs with corresponding design template.

The recipe creation device 201 exemplified in FIG. 2 displays a pattern image as exemplified in FIG. 5 or a condition setting screen 1301 as exemplified in FIG. 13 on the input device 204, and sets measurement parameters (measurement conditions) by using the input device 204 or a pointing device (not illustrated). The condition setting screen 1301 includes a pattern information setting region 1302, a measurement parameter setting region 1303, and a pattern image display region 1304. For example, the pattern image as illustrated in FIG. 5 is displayed in the pattern image display region 1304. A size of a measurement region may be adjusted by inputting a numerical value to an input window of the measurement parameter setting region 1303, or adjusting a measurement region 1305 displayed in the pattern image display region 1304 by using a pointing device or the like.

A design template is created on the basis of conditions set in the pattern information setting region 1302, and measurement conditions for creating a recipe are set on the basis of conditions set in the measurement parameter setting region 1303. Setting items exemplified in FIG. 13 are only examples, and other parameter setting condition input windows may be displayed.

5. Creation of Recipe

The operations in the above 3 and 4 are repeatedly performed on each coordinate value so that measurement parameters are set, and thus a recipe is created. In the recipe creation device 201 exemplified in FIG. 2, the pattern information setting portion 207 and the measurement condition information setting portion 208 create a recipe on the basis of input information.

6. Preservation of Design Template and Recipe File

When a recipe is created, the operations in the 1 to 5 are repeatedly performed, and a design template and a recipe file are preserved in a preservation database 404 of the recipe creation system. In the recipe creation device 201 exemplified in FIG. 2, a created recipe and a design template which is stored in correlation with the created recipe are stored in the recipe database 202.

7. Recipe Creation Using Existing Recipe

If recipes are accumulated in the preservation database 404 or the recipe database 202, recipes for various patterns are preserved. A description will be made of a recipe creation method using an existing recipe.

8. Input of Measurement Coordinate Value and Design Layout

Operations here are the same as the operations in the above 1 and 2. The recipe creation device 201 exemplified in FIG. 2 receives, for example, information from the pattern information setting region 1302 of the condition setting screen 1301, reads necessary information from the design data storage medium 203, and layout data formed on design data in the pattern image display region 1304 in order to check an appropriate pattern. In a case where the operator confirms that the layout data corresponds to a pattern desired to be measured by the operator, the layout data (pattern information) is selected, and the template creation portion 209 creates a template on the basis of the selection.

9. Design Template Creation

This operation is the same as the operation in the above 3.

10. Output of Measurement Parameter

A measurement parameter output process is different from that in the above 4. In the operation in the above 4, a user checks a pattern image, and sets parameters, but a description will be made of an automatic setting method. A design template similar to the design template created in the above 9 is retrieved from the preservation database 404 of the recipe creation system. For example, a design template similar to a pattern A is found.

For example, as exemplified in FIG. 6, a similar design template is a pattern A' having the exactly same shape of that of the pattern A, or a pattern A" which includes a plurality of patterns, but includes the same pattern as the pattern A among the patterns. As a search result, if a similar pattern A' 405 is extracted, measurement parameters A406 which are preserved as a pair with a design template thereof can be automatically acquired.

In the recipe creation device 201 exemplified in FIG. 2, the recipe information search portion 210 searches for a recipe having a design template which is the same as or similar to the created design template. In other words, a search with a design template stored in correlation with a recipe as an identifier is performed.

11. Creation of Recipe

The operations in the above 9 and 10 are repeatedly performed on each coordinate value, measurement parameters are automatically set, and thus a recipe can be created. In the recipe creation device 201 exemplified in FIG. 2, the arithmetic processing unit 205 sets measurement parameters or the like included in a retrieved recipe as conditions for a new recipe. In a case where a plurality of candidate recipes are extracted through a search, for example, the candidates may be displayed on the display device of the input device 204, and an operator may select one of the candidates. A use frequency of a recipe correlated with the recipe, final recipe use time, or the number of errors having occurred may be stored, recipe information may be displayed together with the information, or the recipe determination portion 212 may be prepared, and may filter candidates by using the information.

For example, as a use frequency becomes higher, a recipe may be determined as being a reliable recipe in which the number of errors having occurred becomes smaller, and thus the use frequency may be used as an index value, and a recipe whose index value is equal to or greater than a predetermined value may be selected. In a case of the final recipe use time, since a recipe becomes newer, the recipe may become more suitable for the latest device, the final recipe use time may be used as an index value so as to be used for filtering of a plurality of candidates. The number of errors having occurred is an index value indicating reliability, and may thus be used as a filter for selecting a recipe of which the number of errors having occurred is equal to or less than a predetermined value.

The similarity of a template may be used as an index value, and a recipe having a design template whose similarity is high may be selected. A recipe may be selected in which an AND condition (evaluation value) of index values such as the similarity and the use frequency is highest.

Measurement parameters or the like read to the condition setting screen 1301 may be displayed so as to be appropriately corrected. FIG. 11 is a flowchart illustrating a process of creating a new recipe by using an existing recipe. First, a pattern is selected on design data (step 1101). This process corresponds to the above-described "1. Input of Measurement Coordinate Value" and "2. Input of Design Layout". Next, a template is created on the basis of the selected pattern (step 1102 corresponding to "3. Design Template Creation").

The recipe database 202 is searched by using the template generated in the above-described way, and then a recipe is selected (step 1103). During the search, not only a design template but also other measurement parameters may be set in advance, and may then be retrieved. For example, as exemplified in FIG. 12, detailed information of a pattern or conditions such as measurement conditions (measurement parameters) may be also made search targets, and a search for selecting a recipe which is suitable for a design template and is suitable for at least one of such pieces of information may be performed. For example, a search may be performed by using additional information such as a recipe when measuring a device in a specific manufacturing process, and neighboring pattern information other than a design template. However, if a search condition is strict, it may be considered that there is no recipe suitable for the search condition, and, thus, in this case, setting is performed again from step 1101.

The measurement parameters for a recipe, retrieved in the above-described way are displayed on the condition setting screen 1301, conditions are set as necessary (step 1104), and the recipe is registered (step 1105). Conditions are corrected, for example, by changing a size or a position of a cursor 1305 or the like with, for example, a pointing device, or by inputting numerical values from input windows of the measurement parameter setting region 1303.

A recipe correction step is included as mentioned above, and thus it is possible to create a new recipe on the basis of appropriate update of an existing recipe.

Example 2

In the above 10 (output of measurement parameters) in Example 1, if the number of design templates present in the preservation database 404 of the recipe creation system is increased, time for a search is taken. Thus, a description will be made of an Example for a fast search. This is a method in which a recipe configuration file is created, the file is loaded to the recipe creation system, and a recipe is automatically created.

1. Creation of Recipe Configuration File

A recipe configuration file in which file names required to create a recipe are written is created. FIG. 7 illustrates an example of a recipe configuration file. Designated file names are a name of a coordinate value file created in the above 1 of Example 1, a name of a design layout which is input in the above 2 of Example 1, and a name 701 of a recipe used as a base.

The recipe used as a base is a recipe A 304 in FIG. 3, includes a similar pattern, and which is a recipe in which a user has a record in measurement parameters and wishes to create a recipe with the same parameters.

By designating a recipe used as a base, a similar pattern is retrieved not from the whole of the preservation database 404 but only a design template of a pattern included in the recipe, and thus it is possible to considerably reduce recipe creation time.

2. Reading of Recipe Configuration File

The offline recipe system reads the recipe configuration file. Regarding reading means, reading may be performed from a GUI, and there may be a structure in which, if the file is preserved in a predefined location, and the file is automatically read. An operation from the GUI will be described in Example 4.

3. Design Template Creation in Offline Recipe System

An operation here is the same as in the operation in the above 3 of Example 1.

4. Output of Measurement Parameter

A measurement parameter output process is different from that in the above 10 of Example 1. In the operation in the above 10 of Example 1, a design template similar to a created design template is retrieved from the whole of the preservation database of the recipe creation system, but, in Example 2, only a design template included in abase recipe is narrowed and retrieved. Thus, search time is reduced. Measurement parameters preserved as a pair with the design template are acquired, the parameters are automatically set.

An advantage of designating a base recipe is not only to reduce time. A pattern shape to be measured has a predefined fundamental pattern. This is used as a fundamental pattern. If a plurality of fundamental patterns are included in abase pattern, measurement parameters for a plurality of patterns can be set only by designating a recipe, and thus it is possible to save the time and effort to set measurement parameters for each pattern.

If a recipe is actually performed on a device, there is a case where measurement cannot be performed due to measurement errors or the like. In this case, measurement parameters are tuned to be changed to appropriate values so that measurement errors do not occur on a device, and thus a recipe is changed. According to the above-described Example, a recipe in which corrected parameters are reflected can be created by designating a changed recipe, and thus it is possible to reduce the time and effort to reflect changed parameters in measurement parameters.

5. Creation of Recipe

The operation in the above 4 is repeatedly performed on each coordinate value, measurement parameters are automatically set, and thus a recipe is created.

Example 3

In Examples 1 and 2, a user inputs a measurement coordinate value, but, if a design layout is used, a patient to be measured can be automatically extracted. There is a demand to measure all measurement points instead of sampled measurement points, and a function of automatically extracting coordinate values is a necessary function in the future.

1. Setting of Measurement Pattern

FIG. 8 illustrates a summary of coordinate value extraction. First, a pattern 801 to be measured is designated. A pattern in an existing recipe may be designated, and may be designated from a new design layout.

2. Search for Cell Name Corresponding to Measurement Pattern

In a case where a pattern is retrieved from the entire design layout, a cell name is retrieved, and a location thereof is extracted so that a coordinate value of the pattern can be calculated. This will be described by using a design layout configuration 802 in FIG. 8. A design layout is formed of a plurality of cells, and a plurality of cells may be treated as a single cell for each pattern. For example, a design layout may be created with respect to the pattern A by using a cell A on the design layout. Therefore, the cell A defining the pattern A is retrieved from a set layout.

3. Output of Location of Cell a from Design Layout

A design layout includes an arrangement coordinate value of the cell A. An arrangement location thereof is output. The arrangement location has the same position coordinate value as that of the pattern A, and thus the position coordinate value of the pattern A is output to a coordinate value file.

4. Creation of Coordinate Value File

The operations in the above 1 to 3 are repeatedly performed for each pattern, a position coordinate value is output to the coordinate value file, and thus a coordinate value file 804 is created. The coordinate value file can be used as the coordinate value input file 401 in Example 2, and can thus be automated instead of user's designation in the above 1 (input of measurement coordinate value) of Example 1.

Example 4

FIG. 9 illustrates an operation GUI example in Example 2. A file designated in FIG. 7 is selected from a GUI. For example, if a basis recipe name is to be selected, a "basis recipe name" button 901 on an upper part in the screen is clicked to be in a selection state, a file list 902 is displayed by clicking on a right button of a mouse, and then a recipe name is selected.

Similarly, if a coordinate value file and a design layout name are selected, and a search button 903 is pressed, data matching a pattern for each coordinate value in the coordinate value file is retrieved from a basis recipe, and is displayed on a screen. A search result checking screen is it is determined in FIG. 10.

A pattern similar to each pattern as a search result is displayed in a basis recipe 5 (1001), and measurement parameters set in the similar pattern in the recipe are displayed in a measurement parameter (1002) column. A recipe can be created by pressing a recipe output button.

This GUI is a screen used to wish to check a search result in Example 2, and, in a case where checking is not necessary, a recipe may be automatically output according to Example 2.

REFERENCE SIGNS LIST

100 SEM
101 ELECTRON SOURCE
102 EXTRACTION ELECTRODE
103 ELECTRON BEAM
104 CONDENSER LENS
105 SCANNING DEFLECTOR
106 OBJECTIVE LENS
107 VACUUM SAMPLE CHAMBER
108 SAMPLE STAGE
109 SAMPLE
110 ELECTRON
111 SECONDARY ELECTRON
112 CONVERSION ELECTRODE
113 DETECTOR
120 CONTROL DEVICE

The invention claimed is:

1. A recipe creation device comprising:
an arithmetic processing device that, on the basis of design data for a semiconductor element, establishes measurement conditions or inspection conditions by a semiconductor measurement device or a semiconductor inspection device and creates the recipe;
an input device for inputting pattern information included in the design data; and
a display device configured to display recipe information of the recipe;

wherein the arithmetic processing device is configured to be able to access a database in which the measurement conditions or inspection conditions, and the inputted pattern information, are stored in associated form, and the measurement conditions or inspection conditions are selected through a search using the inputted pattern information, and to create the recipe based on selected measurement conditions or inspection conditions and the inputted pattern information; and wherein the arithmetic processing device controls the display device to display the selected measurement conditions or inspection conditions, and at least one of:
a use frequency of the measurement conditions or the inspection conditions; and
a use time of the measurement conditions or the inspection conditions,
as information applied to the selected measurement conditions or inspection conditions.

2. The recipe creation device according to claim 1,
wherein the pattern information is a template which is generated on the basis of the design data.

3. The recipe creation device according to claim 1,
wherein the arithmetic processing device generates the recipe on the basis of measurement conditions or inspection conditions selected through the search.

4. The recipe creation device according to claim 1,
wherein the arithmetic processing device displays measurement conditions or inspection conditions selected through the search on a display device.

5. The recipe creation device according to claim 1,
wherein the arithmetic processing device selects the measurement conditions or the inspection conditions on the basis of the recipe information and the pattern information.

6. A method for recipe creation, comprising:
establishing, by an arithmetic processing device, measurement conditions or inspection conditions by a semiconductor measurement device or a semiconductor inspection device on the basis of design data for a semiconductor element;
inputting, by an input device, pattern information included in the design data;
accessing, by the arithmetic processing device, a database in which the measurement conditions or inspection conditions, and the inputted pattern information, are stored in associated form;
selecting, by the arithmetic processing device, the measurement conditions or inspection conditions through a search using the inputted pattern information, and creating the recipe based on selected measurement conditions or inspection conditions and the inputted pattern information; and
displaying, by a display device, recipe information of the recipe;
wherein the arithmetic processing device controls the display device to display the selected measurement conditions or inspection conditions, and at least one of:
a use frequency of the measurement conditions or the inspection conditions; and
a use time of the measurement conditions or the inspection conditions,
as information applied to the selected measurement conditions or inspection conditions.

7. A non-transitory computer-readable medium storing a program, which when executed by a computer, causes the computer to:
establish measurement conditions or inspection conditions by a semiconductor measurement device or a semiconductor inspection device on the basis of design data for a semiconductor element;
receive pattern information included in the design data;
access a database in which the measurement conditions or inspection conditions, and the inputted pattern information, are stored in associated form;
select the measurement conditions or inspection conditions through a search using the inputted pattern information, and create the recipe based on selected measurement conditions or inspection conditions and the inputted pattern information; and
display recipe information of the recipe, the selected measurement conditions or inspection conditions, and at least one of:
a use frequency of the measurement conditions or the inspection conditions; and
a use time of the measurement conditions or the inspection conditions,
as information applied to the selected measurement conditions or inspection conditions.

* * * * *